United States Patent

Sawai

[11] Patent Number: 5,966,647
[45] Date of Patent: *Oct. 12, 1999

[54] PORTABLE RECEIVER HAVING PIVOTALLY CONNECTED CASE ARRANGED TO SHIELD ANTENNA

[75] Inventor: Toshikazu Sawai, Fussa, Japan

[73] Assignee: Casio Computer Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/892,480

[22] Filed: Jul. 14, 1997

Related U.S. Application Data

[63] Continuation of application No. 08/342,800, Nov. 21, 1994.

[30] Foreign Application Priority Data

Nov. 26, 1993 [JP] Japan ................................ 5-320949

[51] Int. Cl.$^6$ .................................................. H04B 1/16
[52] U.S. Cl. ......................... 455/300; 455/90; 455/347; 455/566; 455/575
[58] Field of Search ........................ 455/566, 574, 455/575, 90, 347, 348, 349, 351, 343, 38.1, 38.3, 38.4, FOR 121, 117, 300, 301, 128, 129, 550; 340/825.44, 311.1, 825.69; 343/702; 345/901, 905; 361/814, 803, 752, 755, 759, 807; 200/50.04, 51.09, 51.1; 379/433, 434, 440

[56] References Cited

U.S. PATENT DOCUMENTS

| | | |
|---|---|---|
| 4,845,772 | 7/1989 | Metroka et al. ........................... 379/61 |
| 5,020,137 | 5/1991 | Barsumiam ............................... 455/347 |
| 5,117,073 | 5/1992 | Mischenko ............................. 200/61.7 |
| 5,170,173 | 12/1992 | Krent et al. .............................. 455/347 |
| 5,175,759 | 12/1992 | Metroka et al. ......................... 455/574 |
| 5,182,568 | 1/1993 | Stamps, Jr. et al. ..................... 343/702 |
| 5,260,998 | 11/1993 | Takagi ..................................... 379/433 |
| 5,327,584 | 7/1994 | Adachi et al. ........................... 455/351 |
| 5,335,368 | 8/1994 | Tamura ..................................... 455/90 |
| 5,363,089 | 11/1994 | Goldenberg ............................. 455/347 |
| 5,410,749 | 4/1995 | Siwiak et al. ............................ 455/351 |
| 5,436,625 | 7/1995 | Kubo ................................... 340/825.69 |
| 5,436,954 | 7/1995 | Nishiyama et al. ..................... 379/434 |
| 5,465,401 | 11/1995 | Thompson ................................. 455/90 |
| 5,473,316 | 12/1995 | Takaya ............................... 340/825.44 |

FOREIGN PATENT DOCUMENTS 9013951  11/1990  WIPO .................................... 455/351

Primary Examiner—Reinhard J. Eisenzopf
Assistant Examiner—Lester G. Kincaid
Attorney, Agent, or Firm—Frishauf, Holtz, Goodman, Langer & Chick, P.C.

[57] ABSTRACT

A receiver includes a first case to which an integrated circuit controlling component of the receiver is mounted, and a second case pivotally mounted to the first case and having an antenna mounted thereto. The integrated circuit and the antenna are thus mounted in different cases so as to be separated from each other, and the receiver receives a radio wave with less noise from the integrated circuit. An LCD is mounted to one of the cases such that the LCD is interposed between the antenna and integrated circuit, to substantially shield the antenna from the integrated circuit, when the cases are closed together.

14 Claims, 10 Drawing Sheets

5,966,647

PORTABLE RECEIVER HAVING PIVOTALLY CONNECTED CASE ARRANGED TO SHIELD ANTENNA

This applicaiton is a Continuation of application Ser. No. 08/342,800, filed Nov. 21, 1994.

BACKGROUND OF THE INVENTION

1. Field of the Invention

The present invention relates to a receiver.

2. Description of the Related Art

Use of portable receivers such as a pager, in response to a calling signal received by an antenna of the pager, indicating by sound, display or vibration that a holder of the pager must telephone, has prevailed among business enterprises and persons. Use of a pager is prevailing which receives a calling signal having message information such as a telephone number of a party at a location to make contact and when to make contact and which displays the received message information.

Such a pager usually includes a rectangular casing, a logic board having a central processing unit (CPU) controlling components of the pager, a radio frequency (RF) board having an antenna etc., a liquid crystal display module and a key unit. A flexible cable connects the components of the pager.

If a receiver such as a pager is required to have a multifunction comprising, for example, a computing function and a dialer function, then a CPU is required to have a higher speed of operation. Thus, the amount of noise from the CPU necessarily increases. In this case, if the components of the pager are mounted in the same casing, the noise overlaps a radio wave received by the antenna and therefore the pager cannot detect a necessary signal.

SUMMARY OF THE INVENTION

A first aspect of the present invention comprises a first case to which an integrated circuit controlling components of the receiver is mounted, and a second case pivotably mounted to the first case, the second case having an antenna mounted thereto.

A second aspect of the present invention comprises a receiver core having an antenna mounted thereto, and a lid assembly pivotably mounted to the receiver core and having an integrated circuit and a display which are mounted thereto, the integrated circuit controlling components of the receiver.

A third aspect of the present invention comprises a lid assembly having an antenna mouthed thereto, and a receiver core pivotably joined to the lid assembly and including an integrated circuit controlling components of the receiver.

A fourth aspect of the present invention comprises a receiver core including an integrated circuit controlling components of the receiver, the receiver core including a switch switching a display, a lid assembly mounted to the receiver core by means of a hinge, the lid assembly having an antenna mounted thereto, and the switch being mechanically associated with a latch latching the lid assembly and the receiver core.

A fifth aspect of the present invention comprises a lid assembly including an integrated circuit controlling components of the receiver, the lid assembly including a switch switching a display, and a receiver core joined to the lid assembly by means of a hinge, the receiver core having an antenna mounted thereto, the switch being mechanically associated with a latch latching the lid assembly and said receiver core.

Other objects, features and advantages of the present invention will be apparent from a consideration of the following description, taken in connection with the accompanying drawing.

DETAILED DESCRIPTION OF THE PREFERRED EMBODIMENTS

A first embodiment of the present invention will be described with reference to FIGS. 1–6 hereinafter.

Figure 1:
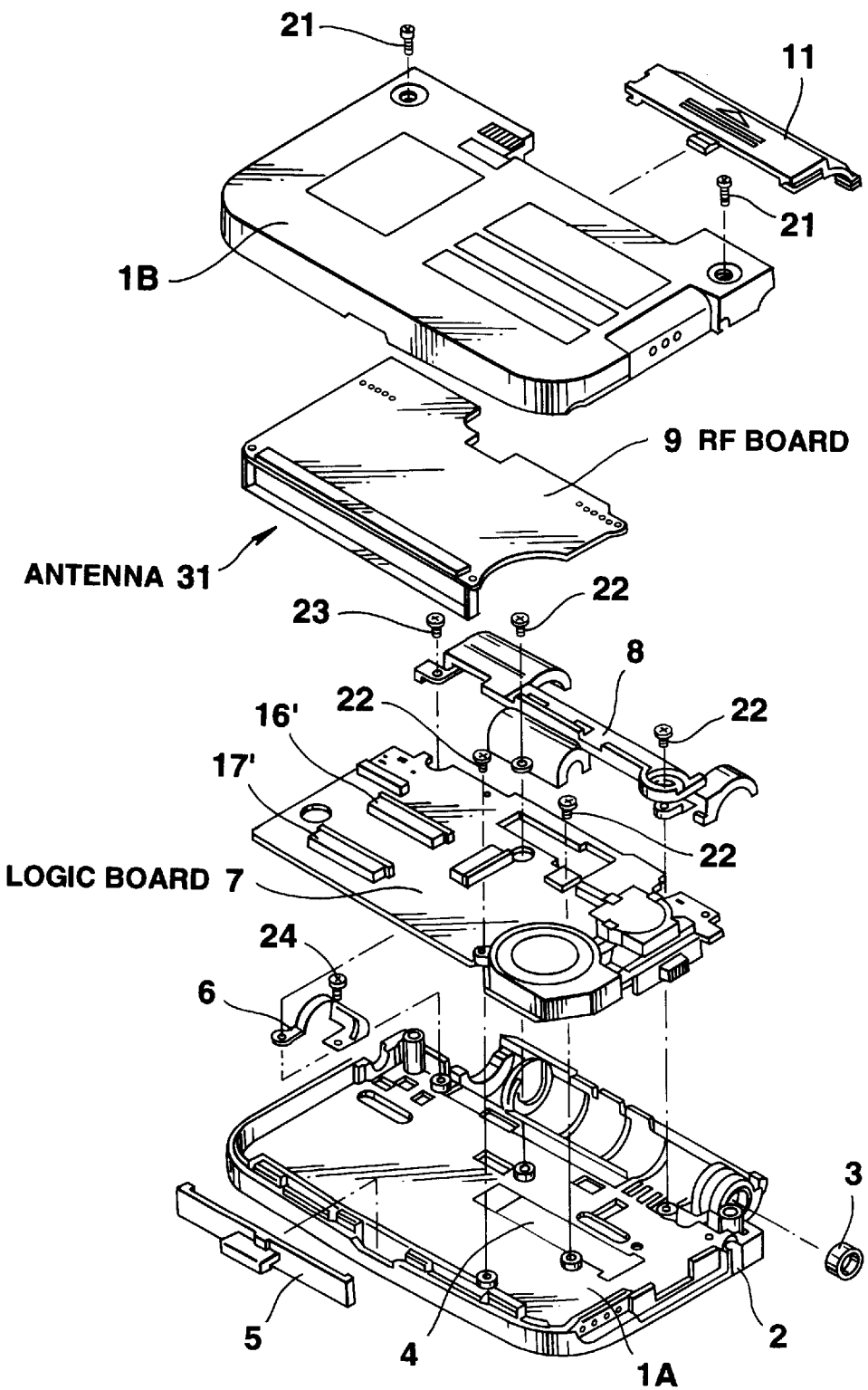
FIG. 1 is an exploded perspective view of an arrangement of core side components of a lidded pager as an example of a receiver according to a first embodiment of the present invention.

FIG. 1 shows an arrangement of core side components of a lidded pager according to the first embodiment of the present invention. An intermediate case is indicated at 1A. An external case is indicated at 1B. A light emitting diode (LED) cover is indicated at 2. A ring is indicated at 3. A sheet key unit is indicated at 4. A handle for unlatching a lid is indicated at 5. A retainer plate is indicated at 6. A logic board is indicated at 7. A battery holder is indicated at 8. A RF board is indicated at 9. A battery lid is indicated at 11. Screws are indicated at 21, 22, 23 and 24. An antenna is indicated at 31.

As seen in FIGS. 1 and 4–6, a core 1 comprises the LED cover 2, the ring 3, the sheet key unit 4 and the handle 5 mounted to the intermediate case 1A, and the retainer plate 6, the logic board 7, the battery holder 8 and the RF board 9 fastened between the intermediate case 1A and the external case 1B by means of the screws 21, 22, 23 and 24.

The RF board 9 has the antenna 31 receiving a radio wave including a calling signal and a message signal, and not-shown elements including an RF circuit having an RF amplifier, a local oscillator, a band-pass filter and an intermediate-frequency integrated circuit (IFIC).

Figure 6:
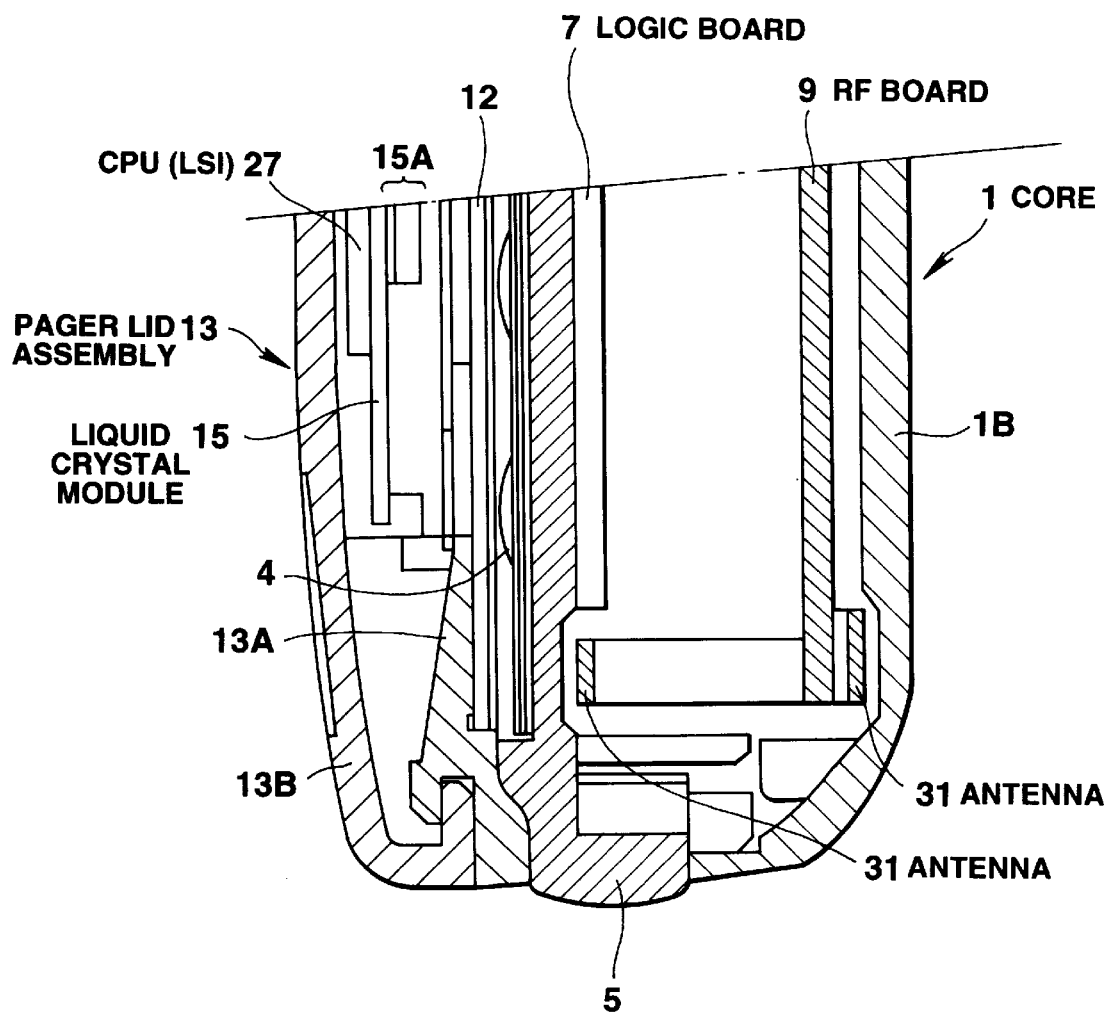
FIG. 6 is an enlarged longitudinal section of a latch portion of FIG. 5.

The antenna 31 is connected to the logic board 7 through a connector (not shown) or the like. As best shown in FIG. 6, the antenna 31 comprises an antenna element 31A having a U-shaped section and a bar-shaped antenna element 31B. The two antenna elements 31A and 31B substantially form a loop. Since the antenna 31 is provided in a thicker side (i.e. a core side) of the pager, the loop aperture area of the antenna 31 is increased and therefore the receiver sensitivity is increased.

The battery lid 11 is removably mounted to the external case 1B.

Figure 2:
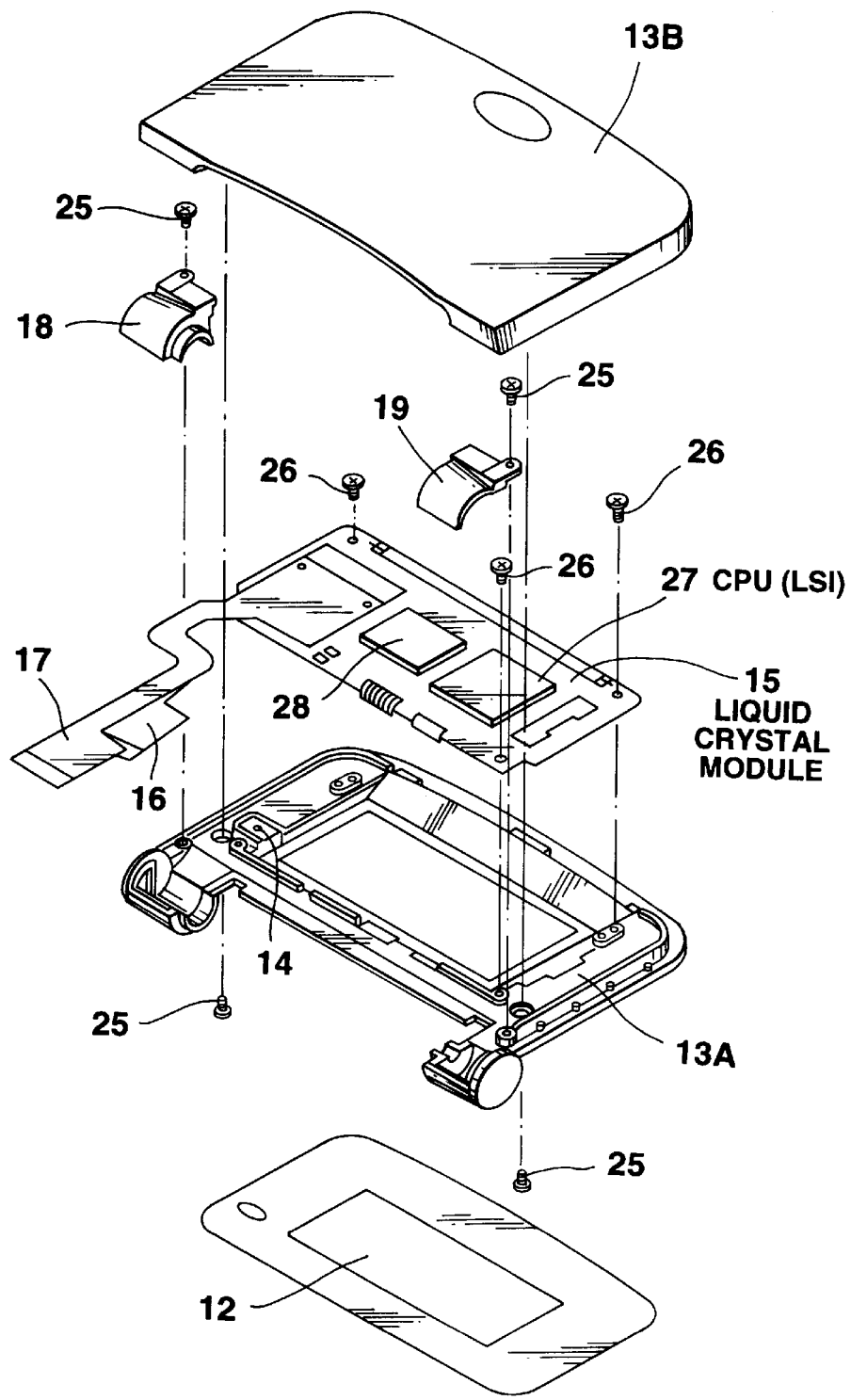
FIG. 2 is an exploded perspective view of an arrangement of lid assembly side components of the pager of FIG. 1.

FIG. 2 shows an arrangement of pager lid-assembly side components of the pager. A printed glass board is indicated at 12. An intermediate case is indicated at 13A. An external case is indicated at 13B. A dialer key is indicated at 14. A liquid crystal module is indicated at 15. Heat seals are indicated at 16 and 17. Holders are indicated at 18 and 19. Screws are indicated at 25 and 26. A CPU made of LSI is indicated at 27. A display driver is indicated at 28.

As shown in FIGS. 2 and 4–6, the pager lid assembly 13 comprises the printed glass board 12 attached to the front surface of the intermediate case 13A, the dialer key 14 mounted on the rear surface of the intermediate case 13A, and the liquid crystal module 15 and the holders 18 and 19 fastened between the intermediate case 13A and the external case 13B by means of the screws 25 and 26.

The two heat seals 16 and 17 are attached to the liquid crystal module 15. As shown in a large scale in FIG. 3, the liquid crystal module 15 includes the CPU 27 controlling the circuit components of the pager and the display driver 28 driving a liquid crystal device (LCD) 15A arranged side by side.

Figure 3:
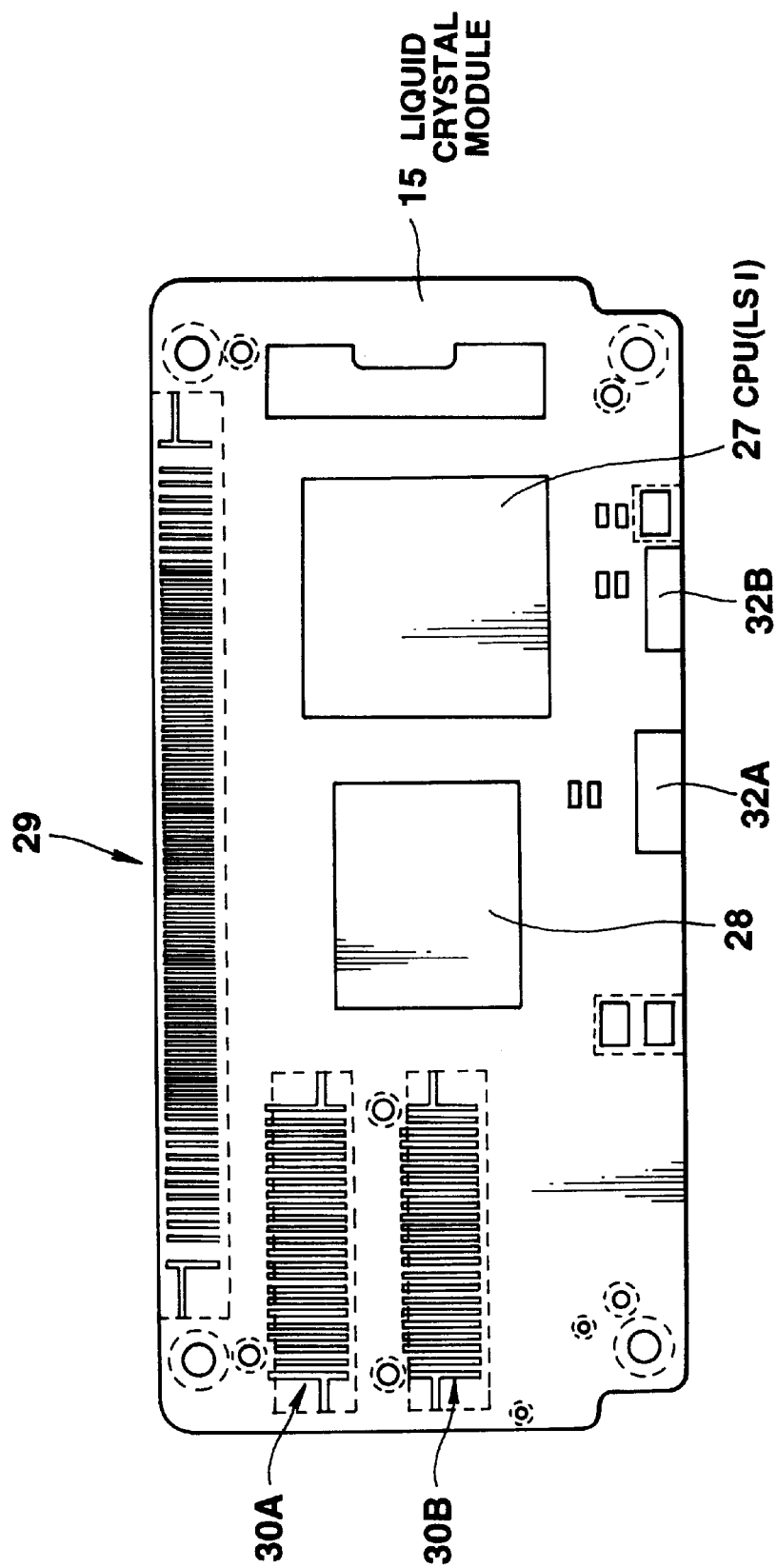
FIG. 3 is a side view of a liquid crystal module shown in FIG. 2 mounted on a lid, projected from a CPU-mounted side surface of the module.

As shown in FIG. 3, the liquid crystal module 15 further includes a LCD terminal 29, connective terminals 30A and 30B, and oscillators 32A and 32B. The heat seals 16 and 17 are joined to the connective terminals 30A and 30B by means of heat seal. The heat seal 16 serves to send signals for driving the LED and a loudspeaker. The heat seal 17 serves to send other signals such as received data. The front ends of the respective heat seals 16 and 17 are joined to connectors 16' and 17' on the logic board 7.

The oscillators 32A and 32B, which are made of quartz or a ceramic material, drive the CPU 27. Oscillators and a CPU have conventionally been mounted to the logic board 7.

Figure 4:
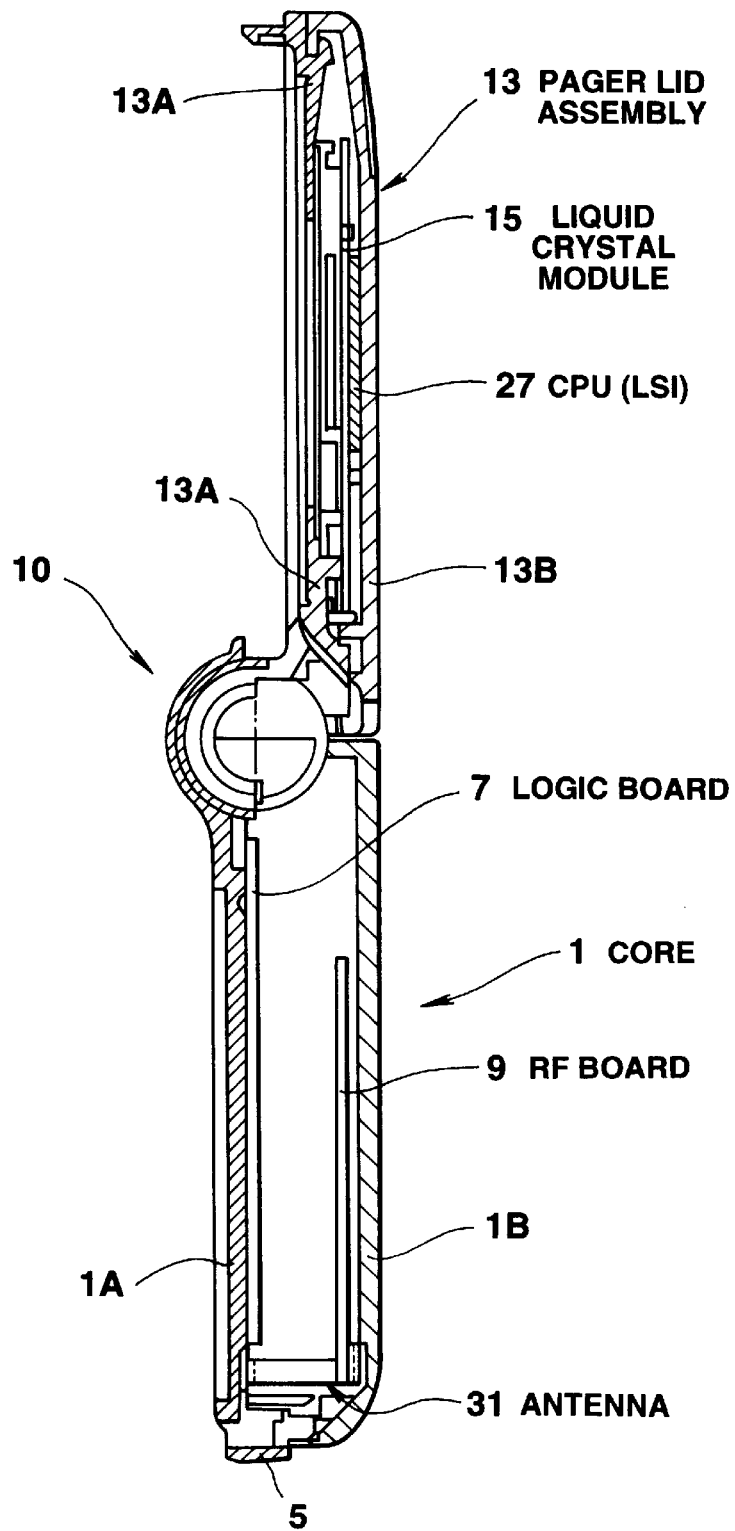
FIG. 4 is a longitudinal section of the pager of FIG. 1 with the lid assembly opened.
Figure 5:
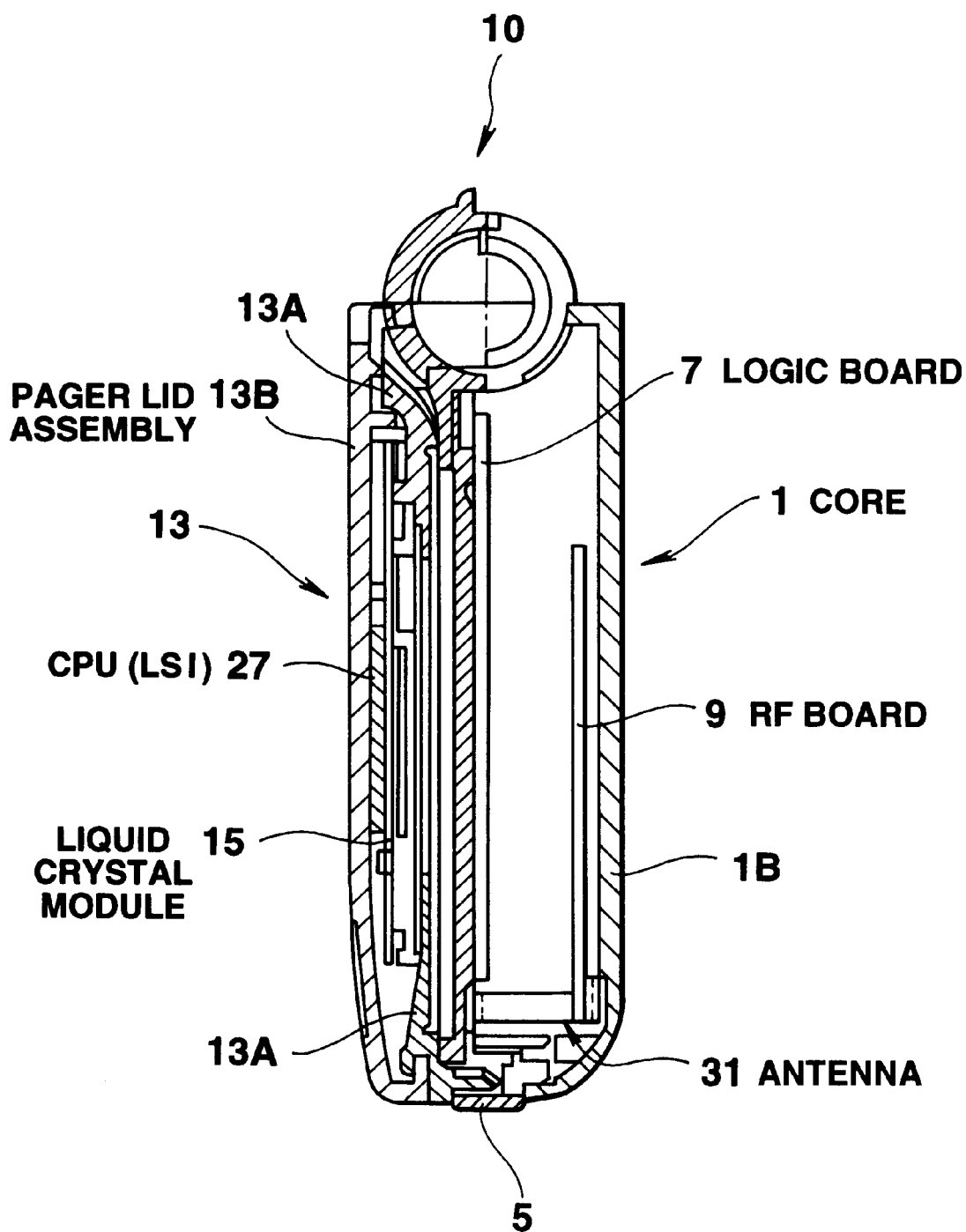
FIG. 5 is a longitudinal section of the pager of FIG. 1 with the lid closed.

As shown in FIGS. 4 and 5, the pager lid assembly 13 is pivotably mounted to the core 1 by means of a hinge 10 to thereby provide the lidded pager. The operational speed of the CPU 27 is increased in order to take in many keyed data through the sheet key unit 4 and provide a computer function and a dialer function.

As described above, the pager has an arrangement in which the antenna 31 mounted to the RF board 9 is arranged between the intermediate case 1A and the external case 1B of the core 1 and on the other hand the CPU 27 mounted to the liquid crystal module 15 is arranged between the intermediate case 13A and the external case 13B of the pager lid assembly 13.

Thus, since the CPU 27, which is a noise source, is inside the pager lid assembly 13, the liquid crystal module 15 separates the CPU 27 in the pager lid assembly 13 from the antenna 31 in the core 1 in a closed position of the pager lid assembly 13 as shown in FIGS. 5 and 6 so that a necessary distance of the CPU 27 from the antenna 31 to reduce a noise provided to the antenna 31 is guaranteed. This increases the receiving sensitivity of the antenna 31.

On the other hand, a distance of the CPU 27 from the antenna 31 in an open position of the pager lid assembly 13 as shown in FIG. 4 is greater than the necessary distance of the CPU 27 in the closed position of the pager lid assembly 13. This further increases the receiving sensitivity of the antenna 31.

Since the heat seal 16 connecting the liquid crystal module 15 side to the logic board 7 serves to send a signal of a relatively high level to drive the LED and the loudspeaker, it tends to cause noise. In the present embodiment, the heat seal 16 is joined to the connector 16' remote from the antenna 31, so that it resists the addition of noise to a signal from the antenna 31. This increases the receiving sensitivity of the antenna 31.

In the above embodiment, the present invention is applied to the lidded pager. The present invention also is applicable to a receiver of a portable foldable telephone set or the like. An ordinary person skilled in the art will understand that the kind of antenna, the structure and the mounted position of an antenna, the mounted position of the CPU, and structures and the arrangement of the components can be modified and changed within the scope and spirit of the invention.

A receiver according to a second embodiment of the present invention will be described with reference to FIGS. 7–10 hereinafter.

In contrast with the first embodiment, the second embodiment has an arrangement in which the CPU is arranged in the core side and the antenna is arranged in the pager lid assembly side. In the second embodiment, a circuit board to which the CPU is mounted includes a switch contact pattern since the CPU is arranged in the core side. A lidded pager according to the second embodiment includes a lid latch for the pager lid assembly. Releasing the lid latch turns a display switch of the receiver on.

Figure 7B:
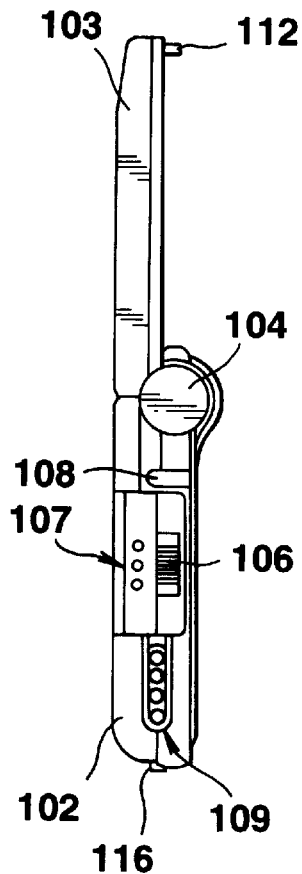
FIG. 7B is a side view of the pager of FIG. 7A.
Figure 7A:
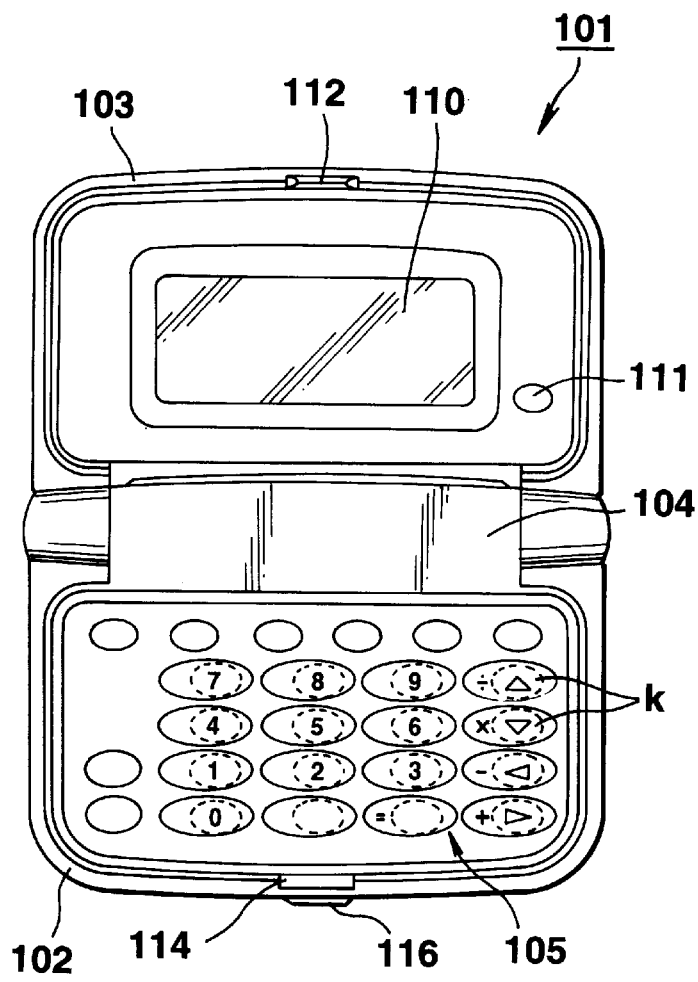
FIG. 7A is a plan view of a lidded pager as an example of a receiver according to a second embodiment of the present invention.
Figure 7C:
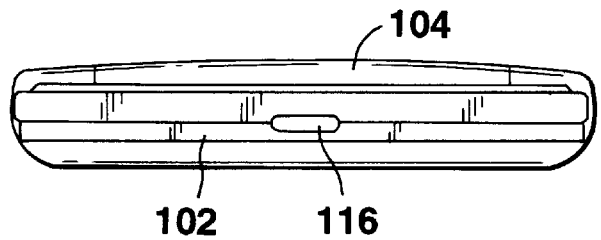
FIG. 7C is a front end view of the pager of FIG. 7A.

FIGS. 7A–7C show a lidded pager 101 according to the second embodiment with a pager lid assembly in an open position. FIG. 7A is a plan view of the pager. FIG. 7B is a side view of the pager of FIG. 7A. FIG. 7C is a front end view of the pager of FIG. 7A.

As shown in FIGS. 7A–7C, the pager 101 comprises the core 102 and a pager lid assembly 103 which are pivotably joined to each other by means of a hinge 104. An upper surface of the core 102 (i.e. an internal surface of the core 102 in a closed position of the pager lid assembly 103) has operating keys 105.

As shown in FIG. 7B, a side surface of the core 102 has a sliding main switch 106, a loudspeaker 107 indicating a receipt of a calling signal, a LED 108 indicating the receipt of the calling signal by means of steady lighting or flickering, and a dialer speaker 109.

As shown in FIG. 7A, an upper surface of the pager lid assembly 103 (i.e. an internal surface in the closed position of the pager lid assembly 103) has a liquid crystal display 110 and a dialer key 111.

Figure 8A:
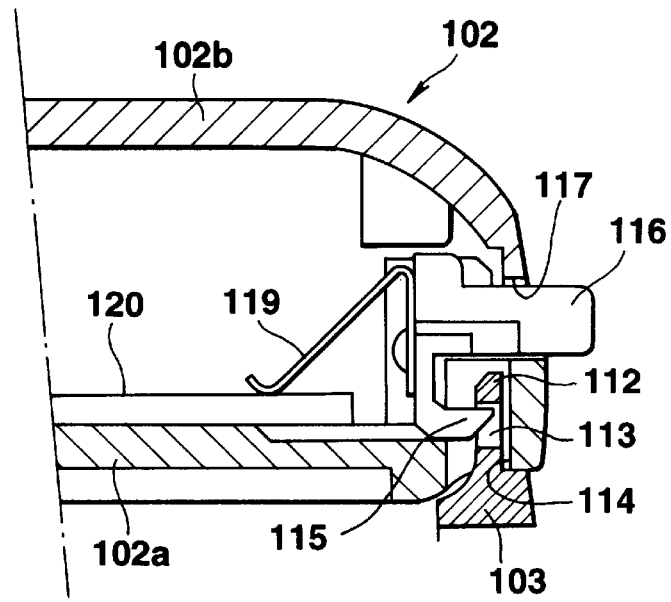
FIG. 8A is a cross section of a lid latch of the pager of FIG. 7A with the lid latch operated.

As best shown in FIG. 7B, the internal surface of the front end of the pager lid assembly 103 opposite to the hinge 104 has a latched projection 112 upright from the internal surface of the pager lid assembly 103. As shown FIG. 8A, the latched projection 112 has a latching through-hole 113 extending through the thickness thereof. A portion of the pager lid assembly 103 mating with the latched projection 112 defines a recess 114. As shown in FIG. 8A, a latching hook 115 is mounted within the recess 114 radially inward of the recess 114.

The latching hook 115 and the latched projection 112 constitute a latch which latches the pager lid assembly 103 to the core 102 in the closed position of the pager lid assembly 103.

The front end of the core 102 opposite to the hinge 104 has an opening knob 116 fastened to the latching hook 115. The opening knob 116 projects forwards out of a through-hole 117 defined in a mating portions of an internal case 102a and an external case 102b of the core 102.

The opening knob 116 is mounted to the interior of the core 102 by means of a leaf spring 118 extending along the width of the core 102. In the closed position of the pager lid assembly 103, the leaf spring 118 causes the opening knob 116 to take a position to project from the through-hole 117.

Figure 8B:
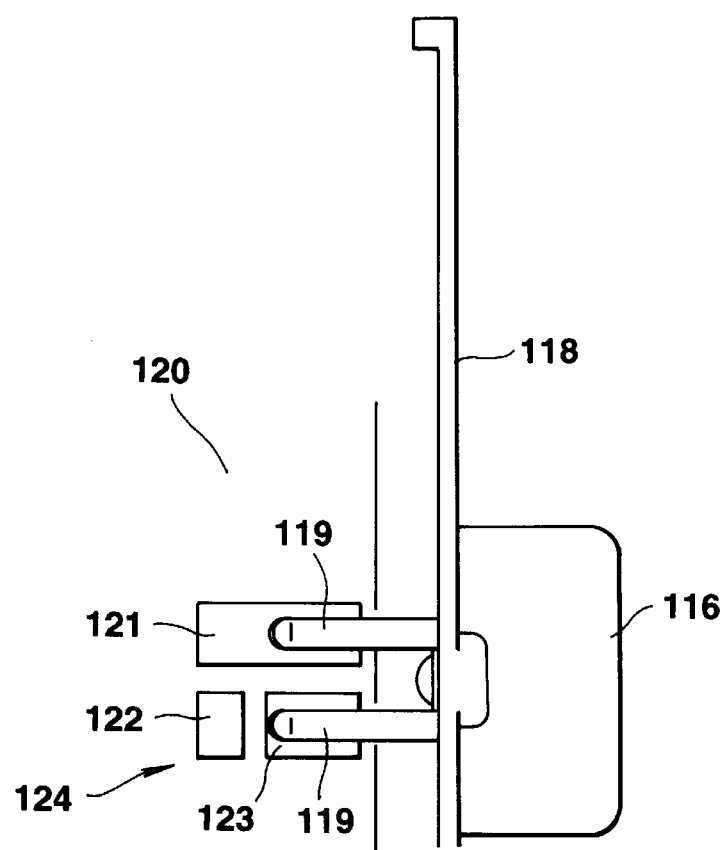
FIG. 8B is a view of a relation between a contact pattern and a contact spring in a state of the pager of FIG. 8A.

The opening knob 116 has a yoke-shaped contact spring including two parts 119 fastened thereto by heat sealing or ultrasonic welding. As shown in FIG. 8B, two parts 119 are in contact with two of three contact patterns 121, 122 and 123 of a circuit board 120 mounted in the core 102.

As shown in FIG. 8B, the three contact patterns comprise the longest rectangular contact pattern 121 which one contact spring 119 is always in contact with, the shortest rectangular contact pattern 122 which is arranged at an innermost position of the arrangement of the contact patterns parallel to the contact pattern 121 and which the other contact spring 119 contacts when the opening knob 116 is pushed most inward in a stroke thereof (i.e. the other contact spring 119 is moved most inward in the stroke thereof), and an intermediate contact pattern 123 which is arranged at an outermost position of the arrangement of the contact patterns and which the other contact spring 119 contacts when the opening knob 116 is in the home position (i.e. the other contact spring 119 is in a returned position).

The two contact patterns 121 and 122 are connected (or wired) to circuit patterns (not shown) of the circuit board 120. The contact pattern 123 is not connected to a circuit pattern of the circuit board 120 and constitutes a no-voltage dummy.

When the two contact springs 119 are concurrently in contact with the contact patterns 121 and 122, the liquid crystal display 110 is in a position to display the content of an income message. A display switch 124 is thus structured.

In contrast with the first embodiment, the second embodiment has an arrangement in which the circuit board 120 having a CPU mounted thereto is arranged in the core 102 side, and an antenna and an RF board are arranged in the pager lid assembly 103 side. Once the antenna receives a calling signal and a message signal, the loudspeaker 107 indicates the receipt thereof, the LED 108 indicates the receipt thereof by means of steady lighting or flickering, and the liquid crystal display 110 takes the position to display the content of a message including a telephone number of a calling party, and the name of a place to make contact and when to make contact.

A pager including, for example, a vibrator indicates a receipt of a calling signal and a message signal by means of vibration.

The opening-and-closing operation of the pager lid assembly 103 of the pager 101 will be described hereinafter.

FIG. 8A shows the operation of the latch in the closed position of the pager lid assembly 103. The front end of the latching hook 115 fastened to the opening knob 116 passes into the latching through-hole 113 in the latched projection 112 of the pager lid assembly 103 to operate the latch. The resilience of the leaf spring 118 maintains the latched position of the pager lid assembly 103 unless the opening knob 116 is pushed inward.

In the latched position of the pager lid assembly 103, the respective contact springs 119 are in contact with the contact pattern 121 and the contact pattern 123. Since the contact pattern 123 is the no-voltage dummy which is not electrically connected to the circuit pattern on the circuit board 120, the display switch is in an off position. Thus, the liquid crystal display 110 is off.

As shown in FIGS. 9A–10A, when the pager lid assembly 103 is opened, the opening knob 116 is pushed to remove the latching hook 115 from the latching through-hole 113 in the latched projection 112 to unlatch the pager lid assembly 103.

After unlatching, a user turns the pager lid assembly 103 on the hinge 104 to the open position of the pager 101 as shown in FIGS. 7A–7C.

During unlatching, the one contact spring 119 continues to be in contact with the longest contact pattern 121 and the other contact spring 119 is out of contact with the intermediate contact pattern 123 and then in contact with the shortest contact pattern 122. Thus, the display switch is turned on, so that the liquid crystal display 110 displays an incoming message including a telephone number of a calling party, the name of a place to make contact and when to make contact.

Thereafter, when the user releases the opening knob 116, the resilience of the leaf spring 118 returns the opening knob 116 to the home position as shown in FIGS. 8A and 8B, and the one contact spring 119 continues to be in contact with the longest contact pattern 121, and the other contact spring 119 is out of contact with the shortest contact pattern 122 and then in contact with the intermediate contact pattern 123. Once the display switch 124 has been turned on, a circuit causes a timer to continue the on state of the display switch 124 for a predetermined period of time.

Thus, in response to the indication of the receipt of a calling signal and a message signal by the loudspeaker 107, the LED 108 or the vibrator, the user must only push the opening knob 116 to turn the pager lid assembly 103 on the hinge 104 in order to see the content of a message including the telephone number of the calling party, a name of a place to make contact and when to make contact.

The display on the screen of the liquid crystal display 110 disappears in the predetermined period of time set by the timer.

Figure 9A:
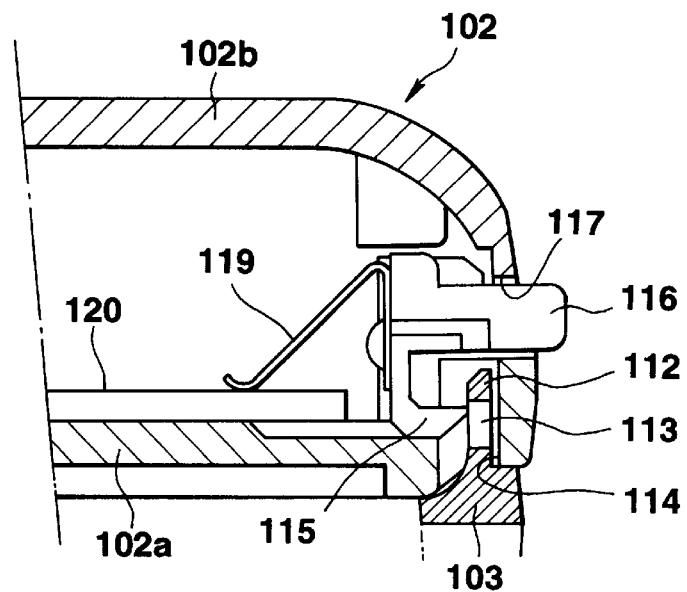
FIG. 9A is a cross section of the lid latch of the pager of FIG. 7A with the lid latch starting releasing or starting operation.

When closing the pager lid assembly 103, the user must only turn it about hinge 104 to the closed position of the pager lid assembly 103 without the need for pushing the opening knob 116. During the closing operation, the latched projection 112 of the pager lid assembly 103 is passed into the recess 114 in the core 102 to move the latching hook 115 inward against the resilience of the leaf spring 118 by means of an engagement of the oblique surface on the front end of the latching hook 115 and surfaces of the latched projection 112, as seen in FIG. 9A. Then, when the oblique surface on the front end of the latching hook 115 is disengaged from the interior surface of the latched projection 112, the front end of the latching hook 115 is passed into the latching through-hole 113 by the resilience of the leaf spring 118 to latch the pager lid assembly 103 and the core 102.

During the latching operation, if the other contact spring 119 were in contact with the contact pattern 122, the display switch 124 would be turned on, so that the liquid crystal display 110 would operate in spite of the closed position of the pager lid assembly 103.

Figure 9B:
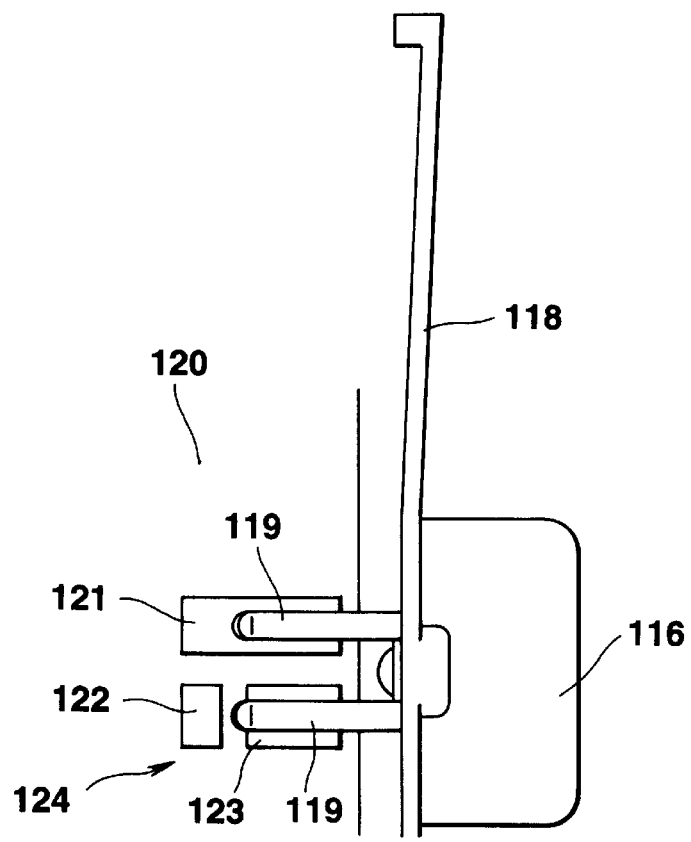
FIG. 9B is a view of a relation between the contact pattern and the contact spring in a state of the pager of FIG. 9A.
Figure 10A:
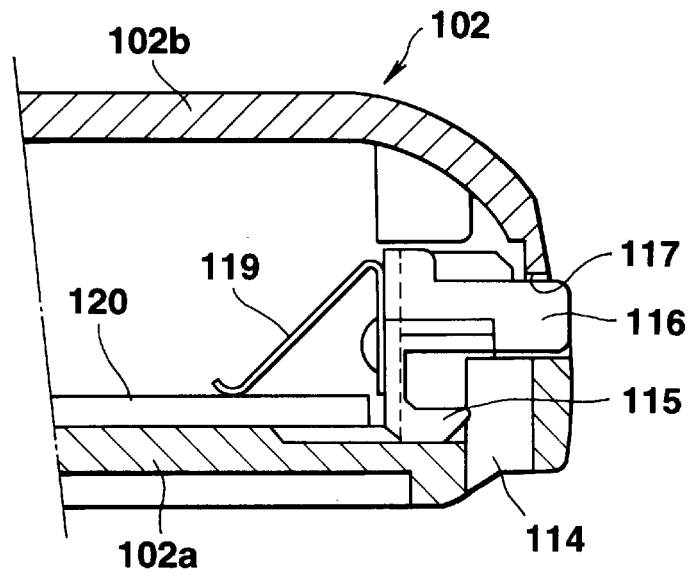
FIG. 10A is a cross section of the lid latch of the pager of FIG. 7A with the lid latch at a releasing moment.
Figure 10B:
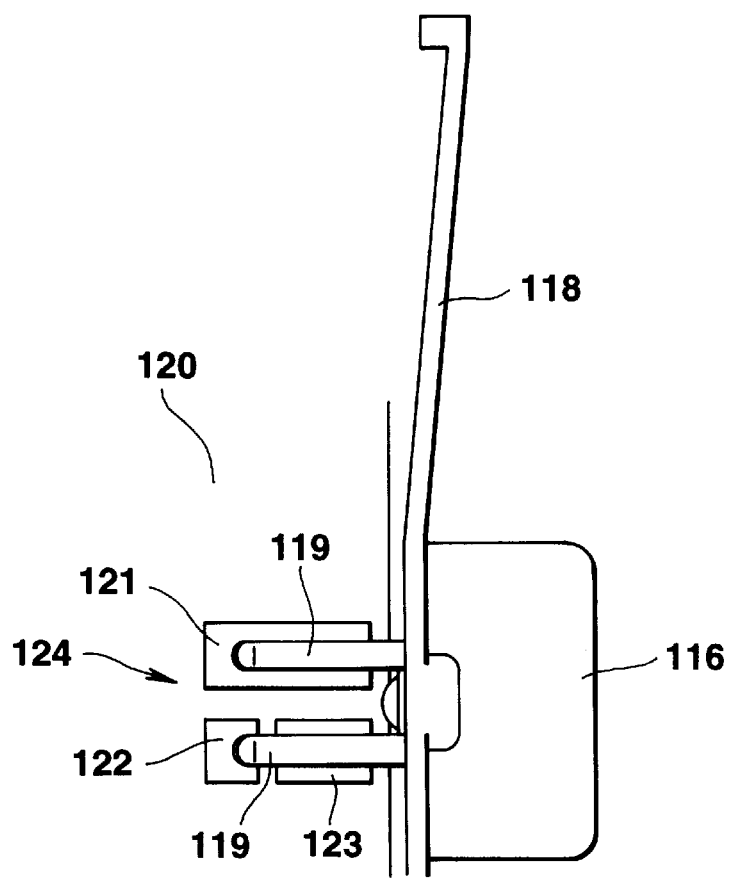
FIG. 10B is a view of a relation between the contact pattern and the contact spring in a state of the pager of FIG. 10A.
Figure 6:
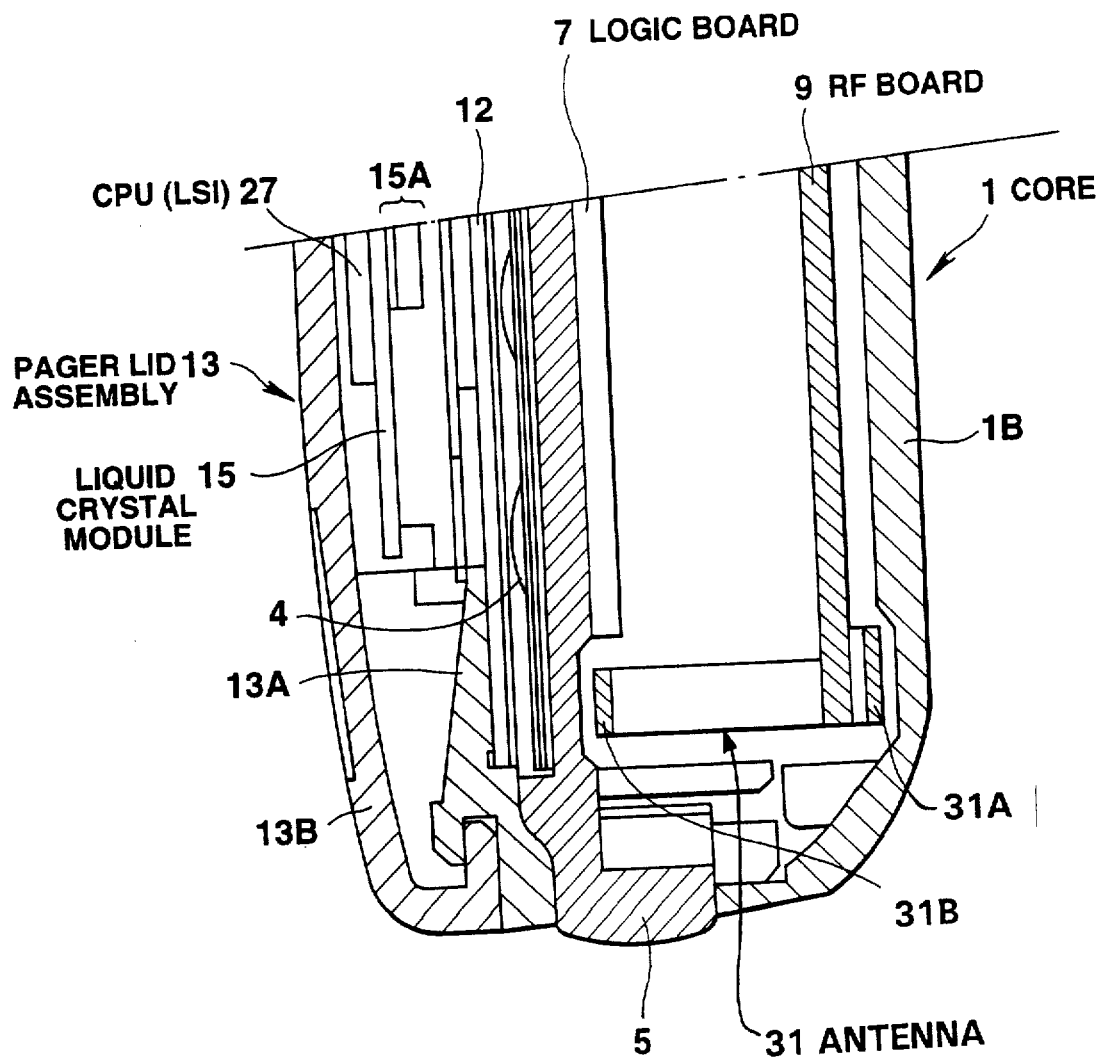

However, as shown in FIGS. 9A and 9B, when the front end of the latching hook 115 is in contact with the interior surface of the latched projection 112 during the closing operation of the pager lid assembly 103, the front end of the other contact spring 119 is out of contact with the shortest contact pattern 122 but continues to be in contact with the intermediate contact pattern 123. Thus, the display switch 124 continues to be off.

As described above, in the first and second embodiments, the display is arranged in the pager lid assembly side. However, the present invention is not limited to these embodiments. For example, the display may be arranged in the core side.

An ordinary person skilled in the art would understand that the structures of the latch, the unlatching mechanism, the display switch and other components can be modified and changed without departing from the scope and the spirit of the invention.

What is claimed is:

1. A portable radio apparatus comprising:
    a first case;
    a second case pivotably mounted to said first case;
    a CPU (Central Processing Unit) for controlling components of the apparatus, said CPU being mounted to one of the first and second cases;
    an antenna for receiving a radio wave, said antenna being mounted exclusively to another of the first and second cases; and
    an LCD (Liquid Crystal Display) for displaying information, said LCD being mounted to one of said first case and said second case such that said LCD is interposed between said antenna and said CPU, to substantially shield the antenna from the CPU, when said first case is pivoted to a closed position relative to said second case, said first case being located over said second case in said closed position.

2. The portable radio apparatus as recited in claim 1, wherein said second case is electrically connected to said first case.

3. The portable radio apparatus as recited in claim 1, wherein said second case is joined to said first case by a hinge.

4. The portable radio apparatus as recited in claim 1, wherein said LCD includes a display section which causes display of information under control of the CPU.

5. The portable radio apparatus as recited in claim 1, wherein said LCD is mounted to said first case, said LCD overlapping with said CPU in a thickness direction of the first case.

6. The portable radio apparatus as recited in claim 1, further comprising:
    an RF (Radio Frequency) circuit mounted to said second case, said RF circuit being coupled to said antenna to receive a signal from said antenna.

7. The portable radio apparatus as recited in claim 1, wherein said first case is an apparatus core and said second case is a lid assembly having a thickness less than that of the apparatus core.

8. The portable radio apparatus as recited in claim 7, wherein said LCD is mounted to said lid assembly.

9. The portable radio apparatus as recited in claim 8, further comprising a sheet key unit, the sheet key unit being mounted to a surface of said apparatus core which is opposite to the LCD when the apparatus core and the lid assembly are closed.

10. The portable radio apparatus as recited in claim 1, wherein said second case is an apparatus core and said first case is a lid assembly having a thickness less than that of the apparatus core.

11. The portable radio apparatus as recited in claim 10, wherein said LCD is mounted to said lid assembly.

12. The portable radio apparatus as recited in claim 10, further comprising a sheet key unit, the sheet key unit being mounted to a surface of said apparatus core which is opposite to the LCD when the apparatus core and the lid assembly are closed.

13. The portable radio apparatus as recited in claim 1, wherein said LCD is mounted to said first case.

14. The portable radio apparatus as recited in claim 1, wherein said LCD is mounted to said second case.

* * * * *

UNITED STATES PATENT AND TRADEMARK OFFICE
CERTIFICATE OF CORRECTION

PATENT NO. : 5,966,647
DATED : October 12, 1999
INVENTOR(S) : Toshikazu SAWAI

It is certified that error appears in the above-identified patent and that said Letters Patent is hereby corrected as shown below:

<u>In the drawings</u>

Replace the sheet of drawing containing Fig. 6 with the sheet attached hereto.

Signed and Sealed this

Fifteenth Day of May, 2001

*Attest:*

NICHOLAS P. GODICI

*Attesting Officer*     *Acting Director of the United States Patent and Trademark Office*